(12) United States Patent
Hsu et al.

(10) Patent No.: US 11,846,889 B2
(45) Date of Patent: Dec. 19, 2023

(54) METHOD AND APPARATUS FOR DIFFRACTION PATTERN GUIDED SOURCE MASK OPTIMIZATION

(71) Applicant: ASML NETHERLANDS B.V., Veldhoven (NL)

(72) Inventors: Duan-Fu Stephen Hsu, Fremont, CA (US); Dezheng Sun, Palo Alto, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 71 days.

(21) Appl. No.: 17/436,305

(22) PCT Filed: Feb. 20, 2020

(86) PCT No.: PCT/EP2020/054545
§ 371 (c)(1),
(2) Date: Sep. 3, 2021

(87) PCT Pub. No.: WO2020/182440
PCT Pub. Date: Sep. 17, 2020

(65) Prior Publication Data
US 2022/0179325 A1 Jun. 9, 2022

Related U.S. Application Data

(60) Provisional application No. 62/815,854, filed on Mar. 8, 2019.

(51) Int. Cl.
*G03F 7/00* (2006.01)
(52) U.S. Cl.
CPC ...... *G03F 7/70641* (2013.01); *G03F 7/70625* (2013.01); *G03F 7/70633* (2013.01); *G03F 7/70683* (2013.01)

(58) Field of Classification Search
CPC ............ G03F 7/70641; G03F 7/70625; G03F 7/70633; G03F 7/70683; G03F 7/70125; G03F 7/70441; G03F 7/705
See application file for complete search history.

(56) References Cited

U.S. PATENT DOCUMENTS

| 5,229,872 A | 7/1993 | Mumola |
| 6,046,792 A | 4/2000 | Van Der Werf et al. |
| (Continued) | | |

FOREIGN PATENT DOCUMENTS

WO 2014127986 8/2014

OTHER PUBLICATIONS

Li et al., Joint optimization of source, mask, and pupil in optical lithography, Proc. of SPIE, vol. 922, 2015 (Year: 2015).*

(Continued)

*Primary Examiner* — Nghia M Doan
(74) *Attorney, Agent, or Firm* — Pillsbury Winthrop Shaw Pittman, LLP

(57) ABSTRACT

A diffraction pattern guided source mask optimization (SMO) method that includes determining a source variable region from a diffraction pattern. The source variable region corresponds to one or more areas of a diffraction pattern in a pupil for which one or more pupil variables are to be adjusted. The source variable region in the diffraction pattern includes a plurality of pixels in an image of a selected region of interest in the diffraction pattern. Determining the source variable region can include binarization of the plurality of pixels in the image such that individual pixels are either included in the source variable region or excluded from the source variable region. The method can include adjusting the one or more pupil variables for the one or more (Continued)

areas of the pupil that correspond to the source variable region; and rendering a final pupil based on the adjusted one or more pupil variables.

20 Claims, 12 Drawing Sheets

(56) References Cited

U.S. PATENT DOCUMENTS

| | | | |
|---|---|---|---|
| 6,563,566 B2* | 5/2003 | Rosenbluth | G03F 7/705 |
| | | | 430/311 |
| 7,587,704 B2 | 9/2009 | Ye et al. | |
| 8,351,037 B2 | 1/2013 | Azpiroz et al. | |
| 9,588,438 B2* | 3/2017 | Hsu | G03F 7/70125 |
| 10,025,201 B2 | 7/2018 | Hsu et al. | |
| 2007/0031745 A1 | 2/2007 | Ye et al. | |
| 2007/0050749 A1 | 3/2007 | Ye et al. | |
| 2008/0301620 A1 | 12/2008 | Ye et al. | |
| 2008/0309897 A1 | 12/2008 | Wong et al. | |
| 2009/0157630 A1 | 6/2009 | Yuan | |
| 2010/0162197 A1 | 6/2010 | Ye et al. | |
| 2010/0180251 A1 | 7/2010 | Ye et al. | |
| 2015/0378262 A1 | 12/2015 | Liu et al. | |
| 2017/0082927 A1 | 3/2017 | Hsu et al. | |
| 2018/0120709 A1 | 5/2018 | Hsu et al. | |

OTHER PUBLICATIONS

International Search report and Written Opinion issued in corresponding PCT Patent Application No. PCT/EP2020/054545, dated Jun. 2, 2020.

Rosenbluth, A.E., et al.: "Intensive Optimization of Masks and Sources for 22nm Lithography", Proc. of SPIE, vol. 7274 (2009).

Li, J. et al.: "Joint optimization of source, mask, and pupil in optical lithography", Proc. of SPIE, vol. 9052 (2014).

Hsu, S. et al.: "EUV Resolution Enhancement Techniques (RETs) for k1 0.4 and below", Proc. of SPIE, vol. 9422 (2015).

* cited by examiner

METHOD AND APPARATUS FOR DIFFRACTION PATTERN GUIDED SOURCE MASK OPTIMIZATION

CROSS-REFERENCE TO RELATED APPLICATIONS

This application is the U.S. national phase entry of PCT Patent Application No. PCT/EP2020/054545 which was filed on Feb. 20, 2020, which claims the benefit of priority of U.S. Patent Application No. 62/815,854 which was filed on Mar. 8, 2019 and which is incorporated herein in its entirety by reference.

TECHNICAL FIELD

The present description relates generally to improving and optimizing lithography processes. More particularly, apparatus, methods, and computer programs for diffraction pattern guided source mask optimization configured to increase illumination efficiency and scanner throughput are described.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"). This pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), and the reduction ratio can be different in x and y direction features the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, there is provided a method for configuring a lithographic apparatus, the method comprises determining a source variable region from a diffraction pattern. The source variable region corresponds to one or more areas of a diffraction pattern in a pupil for which pupil variables are to be adjusted. The method comprises adjusting the pupil variables for the one or more areas of the pupil that correspond to the source variable region. The method comprises rendering a final pupil based on the adjusted pupil variables.

In an embodiment, the method further comprises determining the diffraction pattern and the pupil based on a pattern of a source mask design and an initial pupil.

In an embodiment, determining the source variable region for the diffraction pattern comprises selecting a region of interest in the diffraction pattern with different but overlapping diffraction orders.

In an embodiment, the source variable region in the diffraction pattern comprises a plurality of pixels in an image of the selected region of interest in the diffraction pattern. Determining the source variable region further comprises binarization of the plurality of pixels in the image such that individual pixels are either included in the source variable region or excluded from the source variable region.

In an embodiment, the binarization is performed using a sigmoid or hyperbolic binarization function, or any other appropriate function, or by applying the sigmoid and hyperbolic binarization functions (or any other appropriate function) sequentially.

In an embodiment, the source variable region comprises one or more source variable regions.

In an embodiment, non-zero intensity pixels are included in the one or more source variable regions and zero intensity pixels are excluded from the one or more source variable regions.

In an embodiment, determining the one or more source variable regions further comprises dilation of a shape formed by the individual pixels included in the one or more source variable regions.

In an embodiment, binarization and dilation transform the diffraction pattern such that the one or more source variable regions meet a minimum pupil fill ratio value.

In an embodiment, the diffraction pattern is determined using a full rigorous mask three dimensional (M3D) or compact M3D effect or thin mask model.

In an embodiment, the method further comprises determining one or more additional diffraction patterns based on additional patterns of the source, a design target, and a corresponding optimized mask. One or more source variable regions are further determined for the diffraction pattern and the one or more additional diffraction patterns.

In an embodiment, the source variable region in the diffraction pattern comprises a plurality of pixels in an image of the selected region of interest in the diffraction pattern. Individual pixels of the plurality of pixels have a given intensity. In an embodiment, the method further comprises adjusting diffraction pattern amplitude constrained variables to optimize diffraction pattern amplitude level variables. The adjusting of the diffraction pattern amplitude constrained variables to optimize the diffraction pattern amplitude level variables causes changes to pixels having a given intensity between a lower amplitude threshold and an upper amplitude threshold.

In an embodiment, adjusting the pupil variables comprises a pixel base freeform, parametric base source optimization.

In an embodiment, the method further comprises determining the diffraction pattern constrained source variable region, adjusting the pupil variables in the diffraction pattern constrained source variable region, and rendering the final pupil based on the adjusted pupil variables in the diffraction pattern constrained source variable region, to enhance illumination efficiency and increase throughput in a source mask optimization (SMO) process.

In an embodiment, determining the diffraction pattern constrained source variable region, adjusting the pupil variables in the diffraction pattern constrained source variable region, and rendering the final pupil based on the adjusted pupil variables in the diffraction pattern constrained source variable region, optimizes the pupil for generating an aerial image.

In an embodiment, determining the diffraction pattern constrained source variable region, adjusting the pupil variables in the diffraction pattern constrained source variable region, and rendering the final pupil based on the adjusted pupil variables in the diffraction pattern constrained source variable region, optimizes the pupil for generating a resist image.

In an embodiment, determining the diffraction pattern constrained source variable region, adjusting the pupil variables in the diffraction pattern constrained source variable region, and rendering the final pupil based on the adjusted pupil variables in the diffraction pattern constrained source variable region, are performed at any numerical aperture and/or wavelength.

In an embodiment, determining the diffraction pattern constrained source variable region, adjusting the pupil variables in the diffraction pattern constrained source variable region, and rendering the final pupil based on the adjusted pupil variables in the diffraction pattern constrained source variable region, are performed as part of a memory chip, logic chip, and/or microprocessor chip fabrication process.

In an embodiment, determining the diffraction pattern constrained source variable region, adjusting the pupil variables in the diffraction pattern constrained source variable region, and rendering the final pupil based on the adjusted pupil variables in the diffraction pattern constrained source variable region, are performed as part of a source optimization process with a fixed mask.

In an embodiment, determining the diffraction pattern constrained source variable region, adjusting the pupil variables in the diffraction pattern constrained source variable region, and rendering the final pupil based on the adjusted pupil variables in the diffraction pattern constrained source variable region, are performed such that a performance parameter is maintained at an acceptable level.

In an embodiment, the performance parameter is edge placement error (EPE), image log slope (ILS), normalized image log slope (NILS), stochastic edge placement error (SEPE), and/or depth of focus (DOF).

In an embodiment, the method further comprises generating machine readable instructions that can be used for changing a source and/or a mask associated with the lithographic apparatus based on the rendered final pupil.

According to another embodiment, there is provided a computer program product comprising a non-transitory computer readable medium having instructions recorded thereon, the instructions when executed by a computer implementing the method described above.

DETAILED DESCRIPTION

Figure 1:
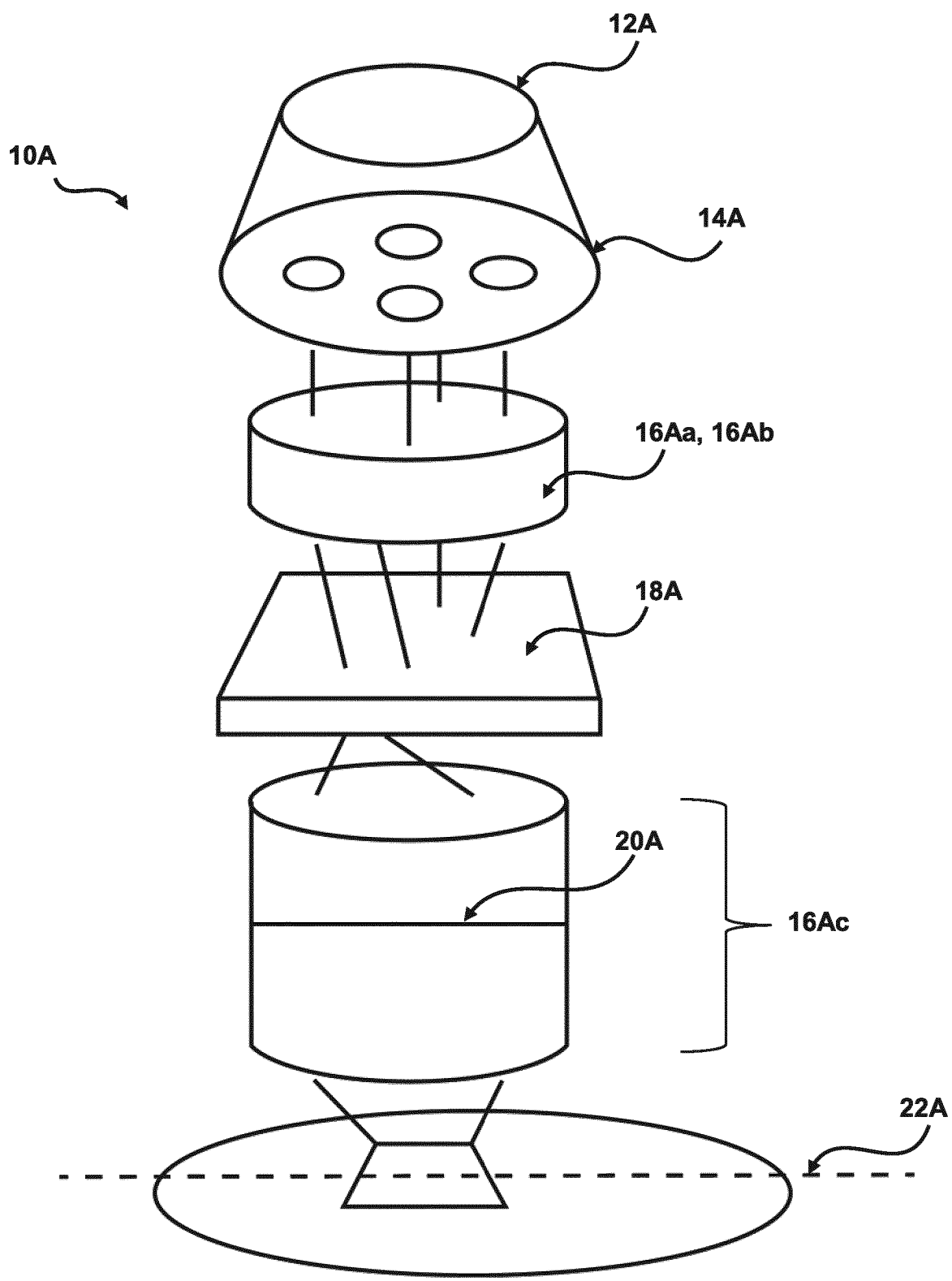
FIG. 1 shows a block diagram of various subsystems of a lithography system.

Illumination efficiency, dose, and/or other parameters impact scanner throughput for imaging operations related to extreme ultraviolet (EUV) and/or other patterning processes. Illumination efficiency is related to a total number of illuminator mirrors (e.g., where a value of 1 indicates an "on" mirror state and 0 indicates and "off" mirror state). Illumination efficiency is or is related to a ratio of the mirrors that direct light to the reticle and the total available mirrors in the illuminator.

A lower illumination efficiency correlates with lower scanner throughput. Scanner throughput is measured in units of wafers per hour, for example. As such, the illumination efficiency is an important factor to consider during source mask optimization (SMO) and/or other operations. If the illumination efficiency can be increased, scanner throughput may also be increased, and the overall manufacturing turn-around time (TAT) and/or costs for a manufacturing a wafer may be reduced.

Continuing scaling of the dynamic random access memory storage node half pitch (DRAM SN HP) has led to smaller diffraction pattern overlap during lithography operations. Because of this smaller diffraction pattern overlap and/or other factors, typical diffraction pattern shaped pupils and post render pupils exhibit low illumination efficiency, which slows scanner throughput.

A new diffraction pattern guided SMO method is described herein. Currently there is no such method, much less a diffraction pattern guided SMO method configured to increase illumination efficiency and increase scanner throughput. The present apparatus and method improve on existing freeform pupil generation methods for SMO. The present apparatus and method may facilitate enhanced parametric source optimization for leaf and/or ellipse, dipole and/or hexapole shaped pupils and/or pupils of other shapes. As described below, the present apparatus and method use a diffraction pattern to define a pupil and a location and/or region of a source variable (e.g., pixels in an image of the diffraction pattern). The present apparatus and method are configured such that pupil variables that correspond to areas of the diffraction pattern in the source variable region may be adjusted (e.g., optimized), and pupil variables that correspond to areas of the diffraction pattern outside the source variable region are not considered during adjustment (e.g., optimization). Optimization boundary conditions may be set up for the source variable region and used to perform freeform source mask optimization and/or other operations. This is a new diffraction pattern guided SMO method that is able to maintain typical edge placement error (EPE), image log slope (ILS), normalized image log slope (NILS), stochastic edge placement error (SEPE), depth of focus (DOF), and/or other values. This method is applicable to aerial images and resist models, for example. This method is applicable for any numerical aperture (NA) and/or wavelength. This method is applicable to any chip design (e.g., memory chips, logic chips, microprocessor chips, and/or other chips).

Although specific reference may be made in this text to the manufacture of ICs, it should be understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass EUV (extreme ultra-violet radiation, e.g. having a wavelength in the range of about 3-100 nm) radiation. However, other applications of the present method with other types of electromagnetic radiation, including ultraviolet radiation (e.g. with a wavelength of 365, 248, 193, 157 or 126 nm), is contemplated.

A patterning device can comprise, or can form, one or more design layouts. The design layout can be generated utilizing CAD (computer-aided design) programs. This process is often referred to as EDA (electronic design automation). Most CAD programs follow a set of predetermined design rules in order to create functional design layouts/patterning devices. These rules are set based processing and design limitations. For example, design rules define the space tolerance between devices (such as gates, capacitors, etc.) or interconnect lines, to ensure that the devices or lines do not interact with one another in an undesirable way. One or more of the design rule limitations may be referred to as a "critical dimension" (CD). A critical dimension of a device can be defined as the smallest width of a line or hole, or the smallest space between two lines or two holes. Thus, the CD regulates the overall size and density of the designed device. One of the goals in device fabrication is to faithfully reproduce the original design intent on the substrate (via the patterning device).

The term "mask", "reticle" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective; binary, phase-shifting, hybrid, etc.), examples of other such patterning devices include a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. Examples of other such patterning devices also include a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be an extreme ultra violet (EUV) source or another type of source (as discussed above, the lithographic projection apparatus itself need not have the radiation source), illumination optics which, for example, define the partial coherence (denoted as sigma) and which may include optics 14A, 16Aa and 16Ab that shape radiation from the source 12A; a patterning device (or mask) 18A; and transmission optics 16Ac that project an image of the patterning device pattern onto a substrate plane 22A.

A pupil 20A can be included with transmission optics 16Ac. In some embodiments, there can be one or more pupils before and/or after mask 18A. As described in further detail herein, pupil 20A can provide patterning of the light that ultimately reaches substrate plane 22A. An adjustable filter or aperture at the pupil plane of the projection optics may restrict the range of beam angles that impinge on the substrate plane 22A, where the largest possible angle defines the numerical aperture of the projection optics NA=n sin($\Theta_{max}$), wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and pro- jection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes that occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), applying OPC using those techniques and models, and evaluating performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each being hereby incorporated by reference in its entirety.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, with each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

Figure 2:
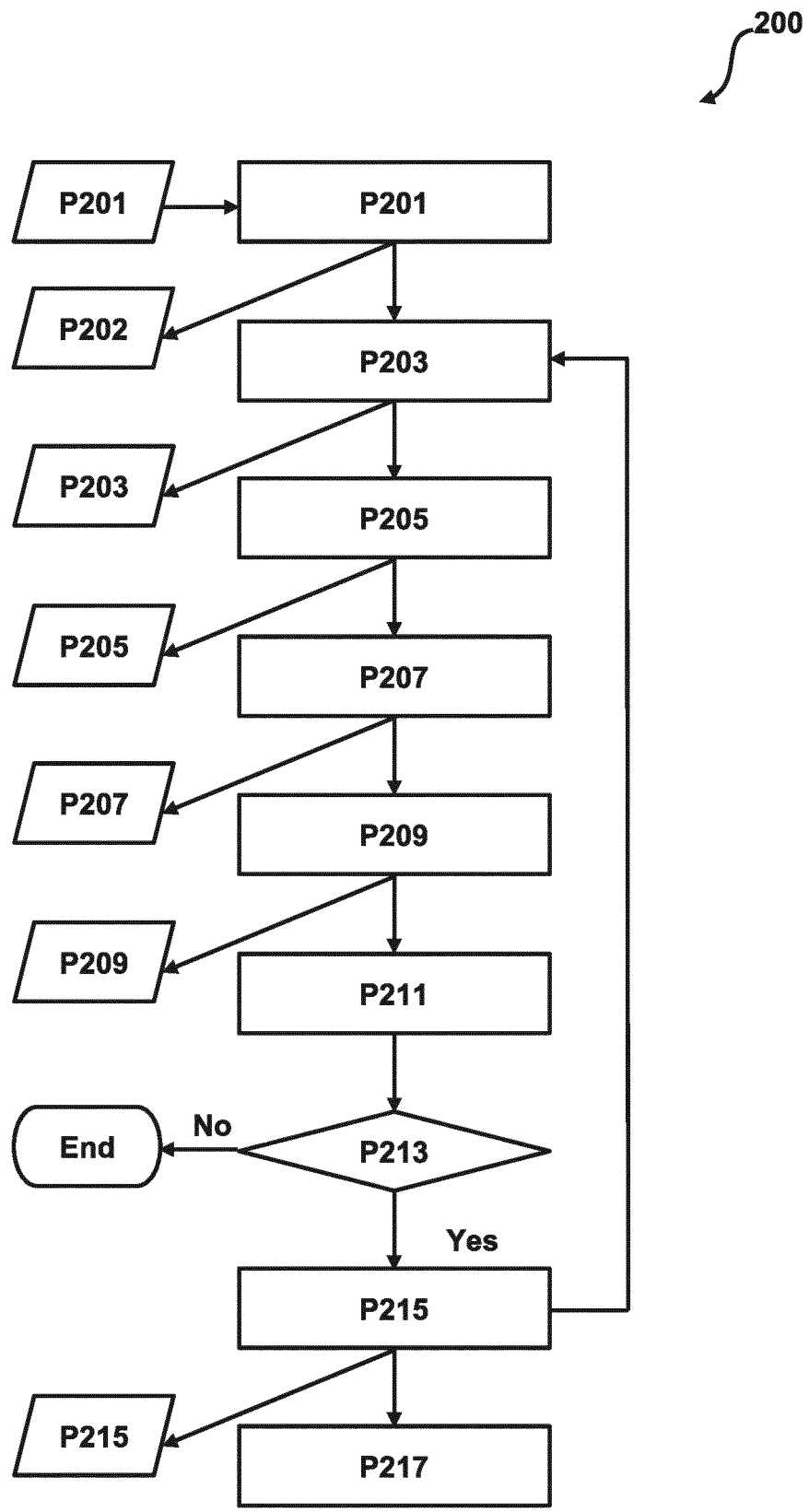
FIG. 2 is flow chart of a method for determining a patterning device pattern or a target pattern to be printed on a substrate, according to an embodiment.

FIG. 2 is flow chart of a method 200 for determining a patterning device pattern (or mask pattern, hereinafter) from an image (e.g., continuous transmission mask image, a binary mask image, a curvilinear mask image, etc.) corresponding to a target pattern to be printed on a substrate via a patterning process involving a lithographic process. In an embodiment, the design layout or the target pattern may be a binary design layout, a continuous tone design layout, or a design layout of another suitable form.

The method 200 is an iterative process, where an initial image (e.g., enhanced image, mask variables initialized from a CTM image, etc.) is progressively modified to generate different types of images according to different processes of the present disclosure to eventually generate information comprising mask patterns or an image (e.g., mask variables corresponding to a final curvilinear mask) further used to fabricate/manufacture a mask. The iterative modification of the initial image may be based on a cost function, where during an iteration the initial image may be modified such that the cost function is reduced, in an embodiment, minimized. In an embodiment, the method 200 may also be referred to as a BINARIZED CTM process, where an initial image is an optimized CTM image which is further processed according to the present disclosure to generate a curvilinear mask patterns (e.g., geometry or polygonal representation shapes of a curvilinear mask or curvilinear pattern). In an embodiment, the initial image may be the enhanced image of the CTM image). The curvilinear mask patterns may be in the form of a vector, a table, mathematical equations, or other forms of representing geometric/polygonal shapes.

In an embodiment, process P201 may involve obtaining an initial image (e.g., a CTM image or an optimized CTM image, or a binary mask image). In an embodiment, initial image 201 may be a CTM image generated by a CTM generation process based on a target pattern to be printed on a substrate. The CTM image may then be received by the process P201. In an embodiment, the process P201 may be configured to generate a CTM image. For example, in a CTM generation technique, an inverse lithography problem is formulated as an optimization problem. The variables are related to values of pixels in a mask image, and lithography metric such as EPE or sidelobe printings are used as cost function. In an iteration of the optimization, the mask image is constructed from the variables and then a process model (e.g., Tachyon model) is applied to obtain optical or resist images and cost functions are computed. The cost computation then gives the gradient values that are used in the optimization solver to update variables (e.g., pixel intensities). After several iterations during optimization, a final mask image is generated, which is further used as guidance map for pattern extraction (e.g., as implemented in Tachyon SMO software). Such an initial image (e.g., the CTM image) may include one or more features (e.g., a feature of a target pattern, SRAFs, SRIFs, etc.) corresponding to the target pattern to be printed on the substrate via the patterning process.

In an embodiment, the CTM image (or an enhanced version of the CTM image) may be used to initialize the mask variables that can be used as the initial image 201, which is iteratively modified as discussed below.

The process P201 may involve generating an enhanced image 202 based on the initial image 201. An enhanced image 202 may be an image where certain selected pixels within the initial image 201 are amplified. The selected pixels may be pixels having relatively lower values (or weak signals) within the initial image 201. In an embodiment, the selected pixels be pixels have signal values lower than, for example, an average intensity of pixels throughout the initial image, or a given threshold value. In other words, pixels with weaker signals within the initial image 201 are amplified, thus enhancing one or more features within the initial image 201. For example, a second order SRAFs around a target feature may have a weak signal that may be amplified. Thus, the enhanced image 202 may highlight or identify additional features (or structures) that may be included within a mask image (generated later on in the method). In a conventional method (e.g., CTM method) of determining a mask image, weak signals within an initial image may be ignored and as such, the mask image may not include features that may be formed from a weak signal in an initial image 201.

The generation of the enhanced image 202 involves applying an image processing operation such as a filter (e.g., an edge detection filter) to amplify weak signals within the initial image 201. Alternatively, or in addition, the image processing operation may be deblurring, averaging, and/or feature extraction or other similar operations. Examples of the edge detection filter include the Prewitt operator, Laplacian operator, Laplacian of Gaussian (LoG) filter, etc. The generation step may further involve combining the amplified signals of the initial image 201 with original signals of the initial image 201 with or without modifying the original strong signals of the initial image 201. For example, in an embodiment, for one or more pixel values at one or more locations (e.g., at contact holes) across the initial image 201, the original signal may be relatively strong (e.g., above a certain threshold such as 150 or below −50), then the original signal at the one or more locations (e.g., at contact holes) may not be modified or combined with the amplified signal for that location.

In an embodiment, noise (e.g., random variation in brightness or color or pixel values) in the initial image 201 may also be amplified. So, alternatively or in addition, a smoothing process may be applied to reduce noise (e.g., random variation in brightness or color or pixel values) in the combined image. Examples of image smoothing methods include Gaussian blur, running average, low-pass filters, etc.

In an embodiment, the enhanced image 202 may be generated using an edge detection filter. For example, an edge detection filter may be applied to the initial image 201 to generate a filtered image that highlights edges of one or more features within an initial image 201. The resulting filtered image may be further combined with the original image (i.e., the initial image 201) to generate the enhanced image 202. In an embodiment, the combining of the initial image 201 and the image obtained after edge filtering may involve modifying only those parts of the initial image 201 that have weak signals without modifying the regions having strong signals, and the combining process could be weighted based on signal strength. In an embodiment, amplifying of the weak signal may also amplify noise within the filtered image. Hence, according to an embodiment, a smoothing process may be performed on the combined image. A smoothing of an image may refer to an approximating function that attempts to capture important patterns (e.g., target pattern, SRAFs) in the image, while leaving out noise or other fine-scale structures/rapid phenomena. In smoothing, the data points of a signal may be modified so individual points (presumably because of noise) may be reduced, and points that may be lower than the adjacent points may be increased leading to a smoother signal or a smoother image. Thus, upon smoothing operation, the further smooth version of the enhanced image 202 having reduced noise may be obtained, according to an embodiment of the present disclosure.

The method, in process P203 may involve generating mask variables 203 based on the enhanced image 202. In a first iteration, the enhanced image 202 may be used to initialize the mask variables 203. In later iterations the mask variables 203 may be updated iteratively.

A contour extraction of a real-valued function $f$ of n real variables, is a set of the form:

$$L_c(f)=\{(x_1,x_2,\ldots,x_n)|f(x_1,x_2,\ldots,x_n)=c\}$$

In a two dimensional space, the set defines the points on the surface at which the function $f$ equals to given value c. In a two dimensional space, the function $f$ is able to extract a closed contour which will be rendered to the mask image.

In the above equation, $x_1, x_2, \ldots x_n$ refer to mask variables such as the intensity of an individual pixel, which determines the locations where the curvilinear mask edge exists with a given constant value c (e.g. a threshold plane as discussed in process P205 below).

In an embodiment, at an iteration, the generating of the mask variables 203 may involve modifying one or more values of variables (e.g., pixel values at one or more locations) within the enhanced image 202 based on, for example, initialization conditions or a gradient map (which may be generated later on in the method). For example, the one or more pixel values may be increased or decreased. In other words, the amplitude of one or more signals within the enhanced image 202 may be increased or decreased. Such modified amplitude of the signals enable generation of different curvilinear patterns depending on an amount of change in the amplitude of the signal. Thus, the curvilinear patterns gradually evolve until a cost function is reduced, in an embodiment, minimized. In an embodiment, further smoothing may be performed on the level mask variables 203.

Furthermore, process P205 involves generating curvilinear mask patterns 205 (e.g., having polygon shapes represented in a vector form) based on the mask variables 203. The generation of the curvilinear mask patterns 205 may involve thresholding of the mask variables 203 to trace or generate curvilinear (or curved) patterns from the mask variables 203. For example, thresholding may be performed using a threshold plane (e.g., an x-y plane) having a fixed value which intersects the signals of the mask variables 203. The intersection of the threshold plane with the signals of the mask variables 203 generate tracings or outlines (i.e., curved polygon shapes) which form polygonal shapes that serve as the curvilinear patterns for the curvilinear mask patterns 205. For example, the mask variables 203 may be intersected with the zero plane parallel to the (x,y) plane. Thus, the curvilinear mask patterns 205 may be any curvilinear patterns generated as above. In an embodiment, the curvilinear patterns traced or generated from the mask variables 203 depend on the signals of the enhanced image 202. As such, the image enhancement process P203 facilitates improvement in patterns generated for a final curvilinear mask patterns. The final curvilinear mask patterns may be further used by a mask manufacturer to fabricate a mask for use in a lithography process.

Process P207 may involve rendering the curvilinear mask patterns 205 to generate a mask image 207. Rendering is an operation performed on the curvilinear mask patterns, which is a similar process as converting rectangle mask polygons into discrete grayscale image representations. Such a process could be generally understood as sampling the box function of continuous coordinates (polygons) into values at each point of image pixels.

The method further involves a forward simulation of the patterning process using process models that generate or predict a pattern 209 that may be printed on a substrate based on the mask image 207. For example, process P209 may involve executing and/or simulating the process model using the mask image 207 as input and generating a process image 209 on the substrate (e.g., an aerial image, a resist image, etch image, etc.). In an embodiment, the process model may include a mask transmission model coupled to an optics model which is further coupled to a resist model and/or etch model. The output of the process model may be a process image 209 that has factored in different process variations during the simulation process. The process image may be further used to determine parameters (e.g., EPE, CD, overlay, sidelobe, etc.) of the patterning process by, for example, tracing the contours of the patterns within the process image. The parameters may be further used to define a cost function, which is further used to optimize the mask image 207 such that the cost function is reduced, or in an embodiment minimized.

In process P211, a cost function may be evaluated based on the process model image 209 (also referred as a simulated substrate image or substrate image or wafer image). Thus, the cost function may be considered as process aware, where variations of the patterning process, enabling generation of curvilinear mask patterns, are accounted for. For example, the cost function may be an edge placement error (EPE), sidelobe, a mean squared error (MSE), Pattern placement error (PPE), normalized image log slope (NILS) or other appropriate variable defined based on the contour of the patterns in the process image. An EPE may be an edge placement error associated with one or more patterns and/or a summation of all the edge placement errors related to all the patterns of the process model image 209 and the corresponding target patterns. In an embodiment, the cost function may include more than one condition that may be simultaneously reduced or minimized. For example, in addition to the MRC violation probability, the number of defects, EPE, overlay, CD or other parameters may be included, and all the conditions may be simultaneously reduced (or minimized).

Furthermore, one or more gradient maps may be generated based on the cost function (e.g., EPE) and mask variables may be modified based on such gradient map(s). Mask variables (MV) refer to intensities of Ø. Accordingly, the gradient computation may be represented as dEPE/dØ, and the gradient values are updated by capturing the inverse mathematical relationship from the mask image (MI) to curvilinear mask polygons to mask variables. Thus, a chain of derivatives may be computed of the cost function with respect to the mask image, from the mask image to curvilinear mask polygon, and from curvilinear mask polygon to mask variables, which allows modification of the values of the mask variables at the mask variables.

In an embodiment, image regularization may be added to reduce the complexity of the mask patterns that may be generated. Such image regularization may be mask rule checks (MRC). MRC refers to the limiting conditions of a mask manufacturing process or apparatus. Thus, the cost function may include different components, for example, based on EPE and MRC violation penalty. A penalty may be a term of the cost function that depends on a violation amount, e.g., a difference between a mask measurement and a given MRC or mask parameter (for example, a mask pattern width and an allowed (e.g., minimum or maximum) mask pattern width). Thus, according to an embodiment of the present disclosure, mask patterns may be designed, and a corresponding mask may be fabricated not only based on forward simulation of the patterning process, but also additionally based on manufacturing limitations of the mask manufacturing apparatus/process. Thus, a manufacturable curvilinear mask producing high yield (i.e., minimum defects) and high accuracy in terms of, for example, EPE or overlay on the printed pattern may be obtained.

The pattern corresponding to a process image should be exactly the same as the target pattern, however, such exact target patterns may not feasible (for example, typically sharp corners) and some conflictions are introduced due to the variations in the patterning process itself and/or approximations in the models of the patterning process. In a first iteration of the method, the mask image 207 may not generate a pattern (in the resist image) which is similar to the target pattern. The determination of accuracy or acceptance of the printed pattern in the resist image (or etch image) may be based on the cost function such as EPE. For example, if the EPE of the resist pattern is high, it indicates that the printed pattern using the mask image 207 is not acceptable and patterns in the mask variable 203 must be modified.

To determine whether a mask image 207 is acceptable, process P213 may involve determining whether the cost function is reduced or minimized, or whether a given iteration number is reached. For example, an EPE value of a previous iteration may be compared with an EPE value of the current iteration to determine whether the EPE has reduced, minimized, or converged (i.e., no substantial improvement in printed pattern is observed). When the cost function is minimized, the method may stop and the curvilinear mask patterns information that is generated is considered as an optimized result.

However, if the cost function is not reduced or minimized, and the mask related variables or enhanced image related variable (e.g., pixel values) may be updated. In an embodiment, the updating may be based on gradient-based method. For example, if the cost function is not reduced, the method 200 proceeds to a next iteration of generating the mask image after performing processes P215 and P217 that indicate how to further modify the mask variables 203

The process P215 may involve generating a gradient map 215 based on the cost function. The gradient map may be a derivative and/or a partial derivative of the cost function. In an embodiment the partial derivative of the cost function may be determined with respect pixels of the mask image and derivative may be further chained to determine partial derivative with respect to the mask variables 203. Such gradient computation may involve determining inverse relationships between the mask image 207 to the mask variables 203. Furthermore, an inverse relationship of any smoothing operation (or function) performed in process P205 and P203 must be considered.

The gradient map 215 may provide a recommendation about increasing or decreasing the values of the mask variables in a manner such that value of the cost function is reduced, in an embodiment, minimized. In an embodiment, an optimization algorithm may be applied to the gradient map 215 to determine the mask variable values. In an embodiment, an optimization solver may be used to perform gradient-based computation (in process P217).

In an embodiment, for an iteration, mask variables may be changed while the threshold plane may remain fixed or unchanged in order to gradually reduce or minimize the cost function. Thus, the curvilinear patterns generated may gradually evolve during an iteration such that the cost function is reduced, or in an embodiment, minimized. In another embodiment, mask variables as well as the threshold plane may both change to achieve faster convergence of the optimization process. Upon several iterations and/or minimization of the cost function may result in final set of BINARIZED CTM results (i.e., a modified version of the enhanced image, mask image, or curvilinear mask).

In an embodiment of the present disclosure, the transition from CTM optimization with grayscale image to BINARIZED CTM optimization with curvilinear mask may be simplified by replacing the thresholding process (i.e. P203 and P205) by a different process where a sigmoid transformation is applied to the enhanced image 202 and corresponding change in gradient computation is performed. The sigmoid transformation of the enhanced image 202 generates a transformed image that gradually evolve into a curvilinear pattern during an optimization process (e.g., minimizing cost function). During an iteration or a step of optimization, variables (e.g., steepness and/or a threshold) related to sigmoid function may be modified based on the gradient computation. As the sigmoid transformation becomes sharper (e.g., increase in steepness of the slope of the sigmoid transformation) in successive iterations, a gradual transition from the CTM image to a final BINARIZED CTM image may be achieved allowing improved results in the final BINARIZED CTM optimization with curvilinear mask patterns.

In an embodiment of the present disclosure, additional steps/process may be inserted into the loop of an iteration of the optimization, to enforce the result to have selected or desired properties. For example, smoothness may be ensured by adding a smoothing step, or other filter may be used to enforce image to favor horizontal/vertical structures.

The present method has several features or aspects. For example, using an optimized CTM mask image with image enhancement methods to improve the signal which may be further used as seeding in an optimization flow. In another aspect, use of the thresholding method with the CTM technique (referred to as BINARIZED CTM) enables generation of curvilinear mask patterns. In yet another aspect, a full formulation (i.e., a closed loop formulation) of gradient computation also allows using a gradient-based solver for mask variable optimization. The BINARIZED CTM results may be used as a local solution (as hotspot repair) or used as a full chip solution. The BINARIZED CTM results may be used together with machine learning as input. This may allow the use of machine learning to speed up BINARIZED CTM. In yet another aspect, the method includes image regularization methods to improve the results. In another aspect, the method involves successive optimization stages to achieve more smooth transitions from grayscale image CTM to binary curvilinear mask BINARIZED CTM. The method allows tuning the threshold of optimization to improve results. The method includes additional transformation into an iteration of optimization to enforce good property of results (require smoothness in BINARIZED CTM image).

As lithography nodes keep shrinking, more and more complicated masks are required. The present method may be used in key layers with EUV scanners, and/or other scanners. The method according to the present disclosure may be included in different aspect of the mask optimization process including source mask optimization (SMO), mask optimization, and/or OPC.

For example, a prior art source mask optimization process is described in U.S. Pat. No. 9,588,438 titled "Optimization Flows of Source, Mask and Projection Optics", which is incorporated in its entirety by reference. Source mask optimization may account for imaging variation across multiple positions of a mask design layout. The design layout may comprise one or more of an entire design layout, a clip, or one or more critical features of the design layout, and/or other layouts. For example, the design layout may be a set of clips that is selected by a pattern selection method based on diffraction signature analysis or any other method. Alternatively, a full chip simulation may be performed, 'hot spots' and/or 'warm spots' may be identified from the full chip simulation, and then a pattern selection step is performed.

Simulating lithography for a lithographic projection apparatus may utilize a source model that represents optical characteristics (including light intensity distribution and/or phase distribution) of the source, a projection optics model that represents optical characteristics (including changes to the light intensity distribution and/or the phase distribution caused by the projection optics) of the projection optics (in some embodiments, the source model and the projection optics model can be combined into a transmission cross coefficient (TCC) model), a design layout model that represents optical characteristics (including changes to the light intensity distribution and/or the phase distribution caused by a given design layout) of a design layout, which is the representation of an arrangement of features on a mask, and/or other models. An aerial image can be simulated from the transmission cross coefficient and the design layout model. A resist image can be simulated from the aerial image using a resist model. Simulation of lithography can, for example, predict contours and CDs in the resist image.

In an embodiment, the source model can represent the optical characteristics of the source that include, but are not limited to, NA-sigma ($\sigma$) settings as well as any particular illumination source shape (e.g. off-axis light sources such as annular, quadrupole, and dipole, etc.). The projection optics model can represent the optical characteristics of the of the projection optics that include aberration, distortion, refractive indexes, physical sizes, physical dimensions, etc. The design layout model can also represent physical properties of a physical mask, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or another file format.

Figure 3A:
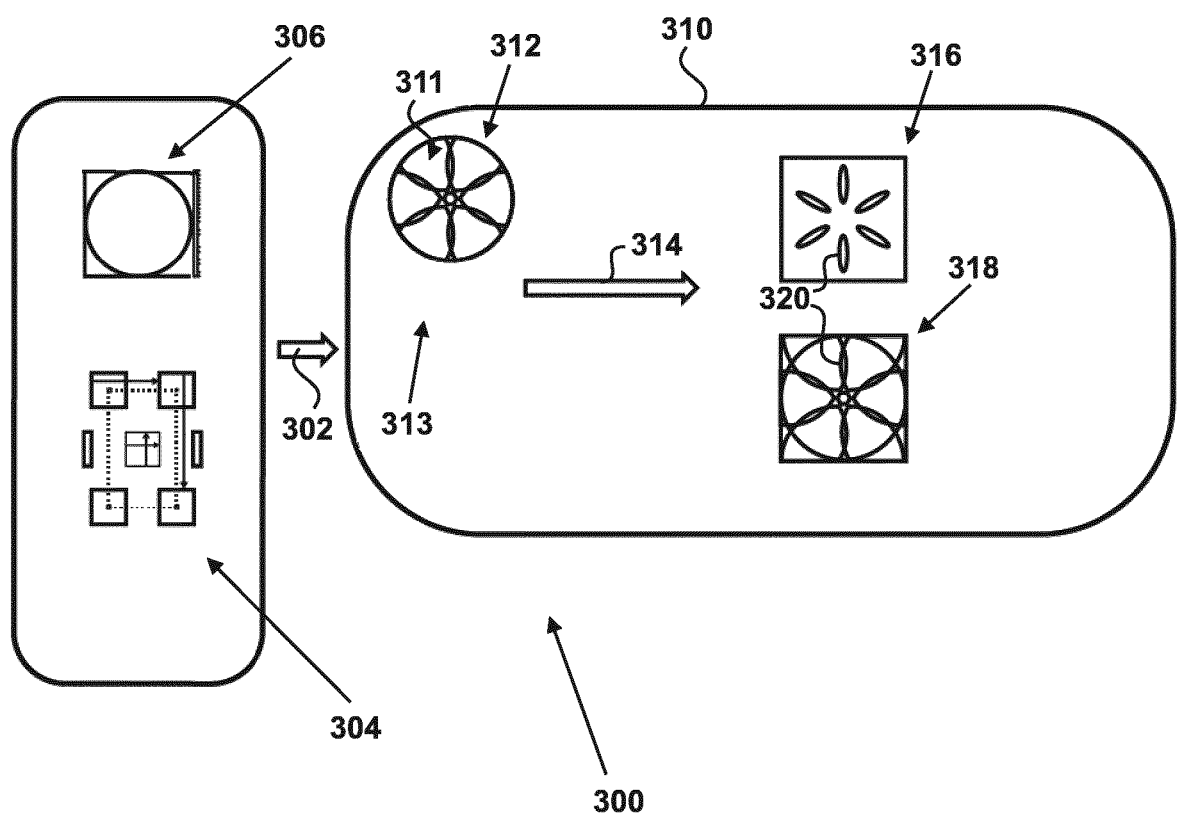
FIG. 3A illustrates aspects of the diffraction pattern guided source mask optimization method, according to an embodiment.
Figure 3B:
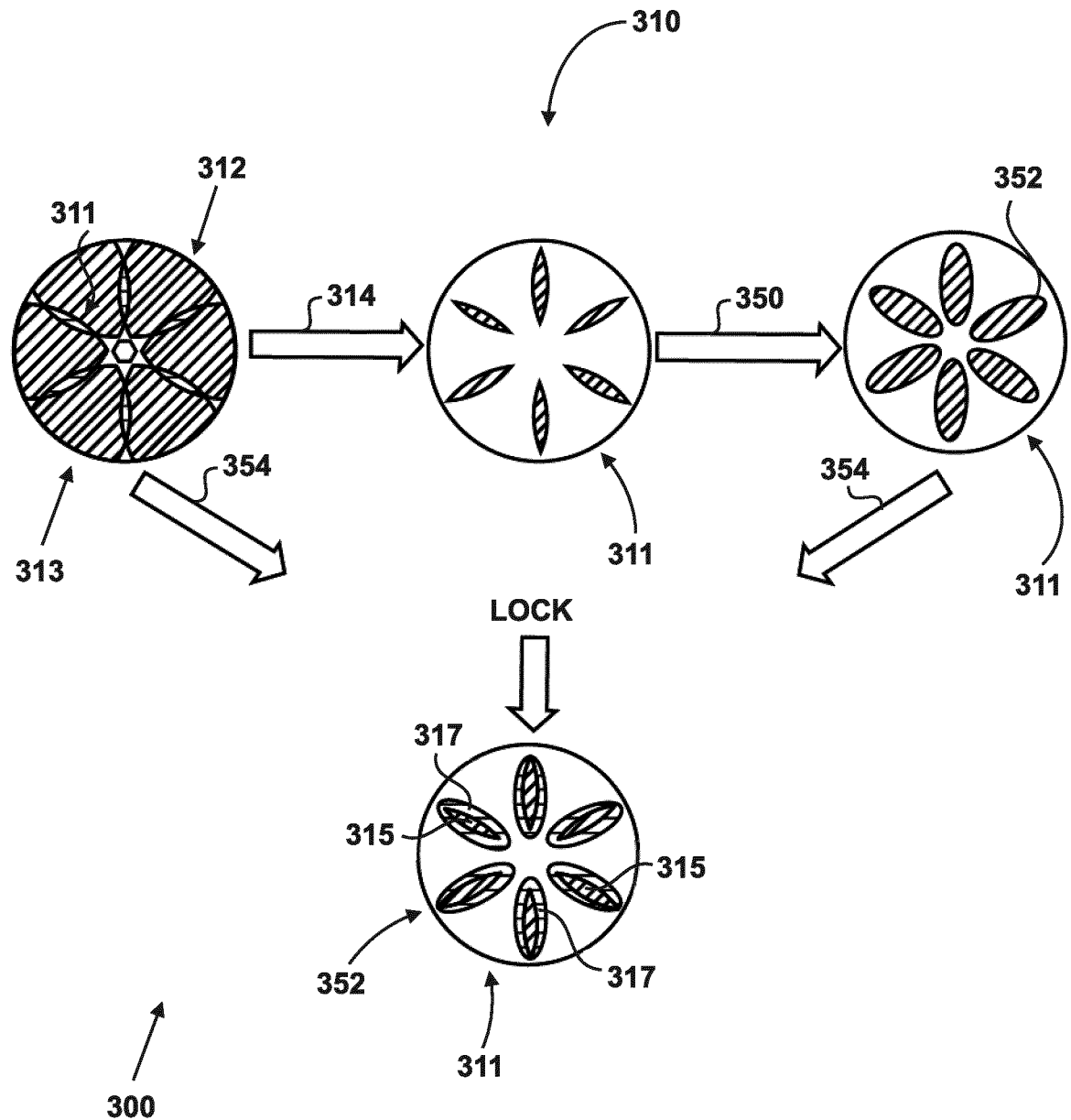
FIG. 3B illustrates additional aspects of the diffraction pattern guided source mask optimization method, according to an embodiment.

Referring to FIG. 3A and FIG. 3B, as described above, the present apparatus and method use a diffraction pattern to define a pupil and a location and/or region of a source variable (e.g., pixels in an image of the diffraction pattern). The present apparatus and method are configured such that pupil variables that correspond to areas of the diffraction pattern in the source variable region may be adjusted (e.g., optimized), and pupil variables that correspond to areas of the diffraction pattern outside the source variable region are not considered during adjustment (e.g., optimization). Pupil variables may include a pupil shape, a position and/or angle of one or more pupil (or pupil related) components (e.g., mirrors), and/or other variables. A pupil variable may be represented in an individual pixel's location and/or intensity. The system may change the change the pixel intensity continuously in different pixel locations, for example. Adjusting pupil variables may change an intensity of one or more pixels in an image of a diffraction pattern, for example, and/or have other effects. Optimization boundary conditions may be set up for the source variable region and used to perform freeform source mask optimization and/or other operations. FIG. 3A and FIG. 3B summarize aspects of this method.

The present method is a method for configuring a lithographic apparatus. The present method is a method for diffraction pattern guided source mask optimization configured to increase illumination efficiency and scanner throughput for a lithography process. As shown in FIGS. 3A and 3B, method 300 comprises determining 302 (FIG. 3A) a diffraction pattern and a pupil based on a pattern of a source mask design 304 (FIG. 3A), an initial pupil 306 (FIG. 3A), and/or other information. In an embodiment, the diffraction pattern is determined using a full rigorous mask three dimensional (M3D) or compact M3D effect or thin mask model.

Referring to FIG. 3A, method 300 includes determining 310 a source variable region 311 from a diffraction pattern 312 (e.g., determined with a thin mask model in this case). Source variable region 311 corresponds to one or more areas of diffraction pattern 312 in a pupil for which pupil variables are to be adjusted. In an embodiment, determining source variable region 311 for diffraction pattern 312 comprises selecting a region of interest in diffraction pattern 312 with different but overlapping diffraction orders (e.g., a $0^{th}$ and $1^{st}$ order in this example). In an embodiment, source variable region 311 in diffraction pattern 312 comprises a plurality of pixels in an image 313 of the selected region of interest in diffraction pattern 312.

Determining source variable region 311 further comprises binarization 314 of the plurality of pixels in image 313 such that individual pixels are either included in source variable region 311 or excluded from source variable region 311. In FIG. 3A, examples of binarization performed for only a four beam region 316 and three and four beam regions combined 318 are shown. Binarization 314 may increase contrast between pixels, for example, to facilitate separation of the pixels into two groups. The two groups may be formed by pixels that show some minimum level of intensity, and pixels that do not show the minimum level of intensity, for example. Minimum intensity thresholds are further described below.

In an embodiment, binarization 314 is performed using a sigmoid binarization function, a hyperbolic binarization function, and/or any other binarization function that allows the present apparatus and method to operate as described herein. In an embodiment, binarization 314 is performed by applying the sigmoid, hyperbolic, and/or any other binarization functions sequentially. In an embodiment, binarization 314 is configured such that non-zero intensity pixels (and/or pixels within minimum and maximum intensity threshold levels) are included in source variable region 311 and zero intensity pixels (and/or pixels that do not breach the minimum intensity threshold level) are excluded from source variable region 311. In examples 316 and 318, binarization 314 has been performed such that pixels in petals 320 are included in the source variable region, and pixels not in petals 320 are excluded from the source variable region.

As shown in FIG. 3B, determining 310 source variable region 311 further comprises dilation 350 of a shape 352 formed by the individual pixels included in source variable region 311, and locking 354 shape 352 such that source variable region 311 becomes fixed. In an embodiment, binarization 314 and dilation 350 transform diffraction pattern 312 such that source variable region 311 meets a minimum pupil fill ratio value. The pupil fill ratio may be or be related to an area of a pupil covered by a diffraction pattern relative to the total possible pupil area. The Pupil Fill Ratio (PFR) for continuous pupils is given by:

$$PFR = \frac{\int I(\delta)d^2\delta}{I_{max}\int d^2\delta}$$

where I(δ) is the source intensity profile in the sigma space, and Imax is the maximum source intensity within the pupil. PFR is the ratio of the pupil that is illuminated.

In an embodiment, dilation 350 comprises an expansion and/or an enlargement of binarized pixels included in source variable region 311. As an example, binarized pixels 315 and enlarged pixels 317 are shown in shape 352 in FIG. 3B. In an embodiment, dilation 350 includes a shape fitting operation, a shape transformation operation, and/or other operations.

Figure 4:
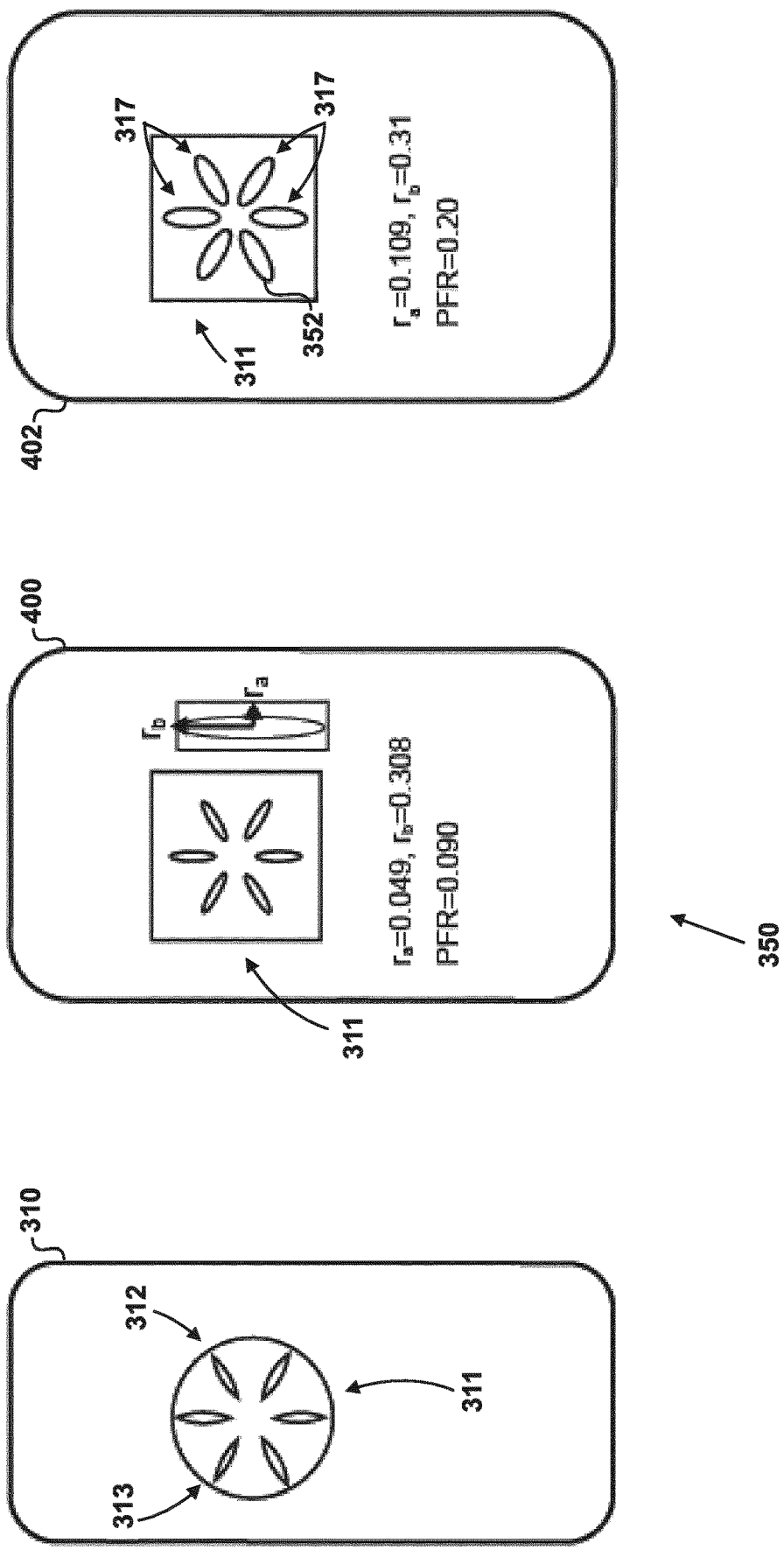
FIG. 4 illustrates dilation of pixels included in a source variable region, with the dilation comprising a shape fitting operation and a shape transformation operation, according to an embodiment.

For example, FIG. 4 illustrates dilation 350 comprising shape fitting operation 400 and shape transformation operation 402. As shown in the example of FIG. 4 (other shape fittings are contemplated), shape fitting operation 400 comprises an ellipse/leaf parameter fitting where $r_a$ and $r_b$ are determined for the ellipse/leaf shapes of binarized source variable region 311. In the example of FIG. 4, $r_a$=0.049 and $r_b$=0.0308 such that the corresponding pupil fill ratio (PFR) is 0.090. In this example, a PFR of 0.090 does not reach a minimum PFR threshold, and dilation 350 continues with shape transformation operation 402. In shape transformation operation 402, the ellipse/leaf shapes are scaled (e.g., enlarged) to meet a minimum PFR threshold of 0.2 (for example). In this example, $r_a$ is scaled to 0.109 and $r_b$ is scaled to 0.31. In this example, $r_a$ and $r_b$ are scaled until the minimum PFR threshold is met. In an embodiment, the minimum pupil fill ratio (min PFR) is a user input spec for source mask optimization (SMO), and/or may be determined in other ways.

Responsive to meeting the minimum PFR threshold, shape 352 (FIG. 3B) is locked 354 (FIG. 3B) such that source variable region 311 becomes fixed (e.g., which may be notated as a variable "srcloc", or source variable location, for example, as described below). Locking sets the region where pupil variables are allowed to be adjusted (e.g., optimized). In the locked (or srcloc) region, nonzero-intensity pixels are allowed to be adjusted/optimized, and locations with zero pixel intensity are forced to be dark during adjustment/optimization flow.

The present method comprises adjusting the pupil variables for the one or more areas of the pupil that correspond to source variable region 311. In an embodiment, the method comprises adjusting pupil variables only for the one or more areas of the pupil that correspond to the source variable region and not adjusting pupil variables for any areas of the pupil that lie outside the source variable region.

In an embodiment, the source variable region in the diffraction pattern comprises a plurality of pixels in an image of the selected region of interest in the diffraction pattern. Individual pixels of the plurality of pixels have a given intensity. In an embodiment, the method further comprises adjusting diffraction pattern amplitude constrained variables to optimize diffraction pattern amplitude level variables (e.g., where intensity=(amplitude)^2). The adjusting of the diffraction pattern amplitude constrained variables to optimize the diffraction pattern amplitude level variables causes changes to pixels having a given intensity above a lower (e.g., minimum) amplitude threshold or between a lower amplitude threshold and an upper amplitude threshold (as described above). For example, a locked (or srcloc) region (defined by x and y coordinates) may be determined using a sigmoid method according to:

$$srcloc\ (x, y) = \frac{1}{1 + e^{-k(DP(x,y)-thres)}}$$

where k is a tunable slope parameter for a sigmoid function that describes the steepness of the transformation near the thres value, DP(x,y) is a description of the x and y locations of pixel amplitude in the diffraction pattern, and thres is a lower (e.g., minimum amplitude threshold). In an embodiment, the lower amplitude threshold and/or other thresholds described herein are determined at manufacture of the present apparatus and/or generation of the present method, determined and/or adjusted by a user of the present apparatus or method, determined based on information generated during prior operations of the present method, and/or determined in other ways. In an embodiment, the lower amplitude threshold and/or the other thresholds described herein are tunable such that the locked region is adjustable by a user.

By way of a non-limiting practical example of how the operations described above may be implemented by software and/or other computer programming, the software may generate a diffraction pattern image (e.g., as described above). The diffraction pattern image may be normalized between (intensities of) [0, 255], for example. An intensity histogram with a bin size of one may be determined. Intensity count sums for intensities between 0 and 255 may be determined, and a fill ratio may be determined according to:

$$extracted\ fill\ ratio = \frac{\int_{255}^{thres} intensity\ count}{\int_{255}^{0} intensity\ count}.$$

Once an extracted fill ratio is greater than or equal to an extraction fill ratio threshold, the process is stopped and an extracted source is generated (e.g., determining 310 source variable region 311 from diffraction pattern 312 as described above related to FIGS. 3A and 3B).

The extracted source is then dilated until the dilated extracted source meets a source fill ratio threshold (e.g., dilation 350 as described above related to FIG. 4). A source location file may be generated (e.g., srcloc.src, locking 354 described above), a source constraint file may be generated (e.g., srcmax.src, srcmin.src), and an initial source file may be generated (initsrc.src). In an embodiment, the initial source file (initsrc.src) may be thought of as the $0^{th}$ and $1^{st}$ order diffraction pattern image multiplied by the srcloc.src file, which is then normalized to [0,1], for example.

As described above, the srcloc file sets the allowed region of the pupil for freeform source optimization. Nonzero-intensity pixels (and/or pixels between minimum and maximum pixel intensity thresholds) are allowed to be adjusted/optimized, and locations with zero pixel intensity (and/or pixels with intensities below the minimum pixel intensity threshold) are forced to be dark during the full adjustment/optimization flow. The srcmax and srcmin files are source (src) files which set the lower and upper bound for individual pixels in a freeform source optimization. In an embodiment, adjusting the pupil variables comprises a pixel base freeform, parametric base source optimization.

Figure 5:
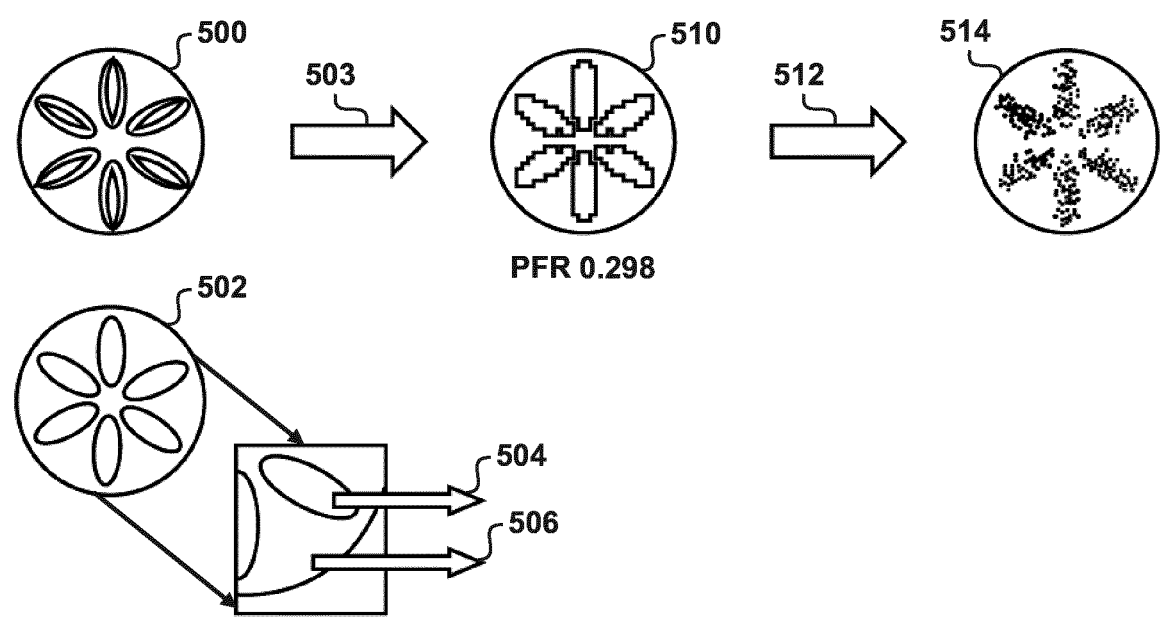
FIG. 5 illustrates rendering a final pupil comprising determining a final discrete source (pupil) generated from a final freeform source (pupil), according to an embodiment.

The present method comprises rendering a final pupil based on the adjusted pupil variables. Rendering the final pupil may comprise determining a final discrete source (pupil) from a final freeform source (pupil) as shown in FIG. 5. FIG. 5 illustrates a representation 500 of an initial source file (initsrc.src) and a representation 502 of source lock file (srcloc.src) used to generate the initial source file. As shown in representation 502, the srcloc file sets the allowed region of the pupil for freeform source optimization 503. Nonzero-intensity pixels (and/or pixels between minimum and maximum pixel intensity thresholds) 504 are allowed to be adjusted/optimized, and locations with zero pixel intensity (and/or pixels with intensities below the minimum pixel intensity threshold) 506 are forced to be dark during the full adjustment/optimization flow. FIG. 5 illustrates a final freeform source (pupil) 510 with a PFR of 0.298 (e.g., after performance of the operations described above). Final freeform source (pupil) 510 is rendered 512 into a final discrete source (pupil) 514. Final discrete source (pupil) 514 in the example shown in FIG. 5 has an illumination efficiency of 0.93 (which is higher than the illumination efficiency of prior final discrete pupils), but with a DOF (10% EL) of 105.4 and a NILS of 2.3 (which are still comparable to the same metrics for prior methods).

In an embodiment, the method further comprises determining one or more additional diffraction patterns based on additional patterns of the source, design target, and a corresponding optimized mask. In an embodiment, the source variable region comprises one or more source variable regions. In an embodiment, the one or more source variable regions may be determined for the diffraction pattern and/or the one or more additional diffraction patterns. In an embodiment, the operations of the method described above may be applied on multiple different diffraction patterns.

For example, the present method may comprise determining multiple diffraction patterns based on multiple corresponding patterns of a source mask design. The multiple corresponding patterns may comprise different clips (e.g., clip 0, clip 1, clip 2, etc.) from the source mask design, and/or other patterns. The multiple diffraction patterns may be used to define a pupil and a location and/or region of a source variable (e.g., overlapping pixels in images of the diffraction patterns from the different clips may be combined into a single image/region to form the source variable region—a single srcloc file). The present apparatus and method are configured such that pupil variables that correspond to overlapping areas of the diffraction patterns in the source variable region may be adjusted (e.g., optimized), and pupil variables that correspond to areas of the overlapping diffraction patterns outside the source variable region are not considered during adjustment (e.g., optimization). Optimization boundary conditions may be set up for the overlapping source variable region and used to perform freeform source mask optimization (e.g., as described above).

In an embodiment, the method further comprises determining the diffraction pattern constrained (e.g., the areas where the pixels may be adjusted/optimized) source variable region, adjusting the pupil variables in the diffraction pattern constrained source variable region, and rendering the final pupil based on the adjusted pupil variables in the diffraction pattern constrained source variable region, to enhance illumination efficiency and increase throughput in a source mask optimization (SMO) process. In an embodiment, determining the diffraction pattern constrained source variable region, adjusting the pupil variables in the diffraction pattern constrained source variable region, and rendering the final pupil based on the adjusted pupil variables in the diffraction pattern constrained source variable region, optimizes the pupil for generating an aerial image. In an embodiment, determining the diffraction pattern constrained source variable region, adjusting the pupil variables in the diffraction pattern constrained source variable region, and rendering the final pupil based on the adjusted pupil variables in the diffraction pattern constrained source variable region, optimizes the pupil for generating a resist image. In an embodiment, determining the diffraction pattern constrained source variable region, adjusting the pupil variables in the diffraction pattern constrained source variable region, and rendering the final pupil based on the adjusted pupil variables in the diffraction pattern constrained source variable region, are performed at any numerical aperture and/or wavelength. In an embodiment, determining the diffraction pattern constrained source variable region, adjusting the pupil variables in the diffraction pattern constrained source variable region, and rendering the final pupil based on the adjusted pupil variables in the diffraction pattern constrained source variable region, are performed as part of a memory chip, logic chip, and/or microprocessor chip fabrication process. In an embodiment, determining the diffraction pattern constrained source variable region, adjusting the pupil variables in the diffraction pattern constrained source variable region, and rendering the final pupil based on the adjusted pupil variables in the diffraction pattern constrained source variable region, are performed as part of a source optimization process with a fixed mask.

In an embodiment, determining the diffraction pattern constrained source variable region, adjusting the pupil variables in the diffraction pattern constrained source variable region, and rendering the final pupil based on the adjusted pupil variables in the diffraction pattern constrained source variable region, are performed such that a performance parameter is maintained at an acceptable level. In an embodiment, the performance parameter is edge placement error (EPE), image log slope (ILS), normalized image log slope (NILS), stochastic edge placement error (SEPE), and/or depth of focus (DOF). As described above, final discrete source (pupil) 514 in the example shown in FIG. 5 has an illumination efficiency of 0.93 (which is higher than the illumination efficiency of prior final discrete pupils), but with a DOF (10% EL) of 105.4 and a NILS of 2.3 (which are still comparable to the same metrics for prior methods).

In an embodiment, the method further comprises generating machine readable instructions that can be used for changing a source and/or a mask associated with the lithographic apparatus based on the rendered final pupil (e.g., 514 shown in FIG. 5). This may include generating the machine readable instructions based on programming code drafted by a user, writing the instructions to a storage device (e.g., a non-transitory storage device), storing the instructions on a server, and/or other operations. The machine readable instructions may comprise lines of code, databases, and/or other arrangements of information stored in files and/or in other electronic formats. These examples are not intended to be limiting.

Figure 6:
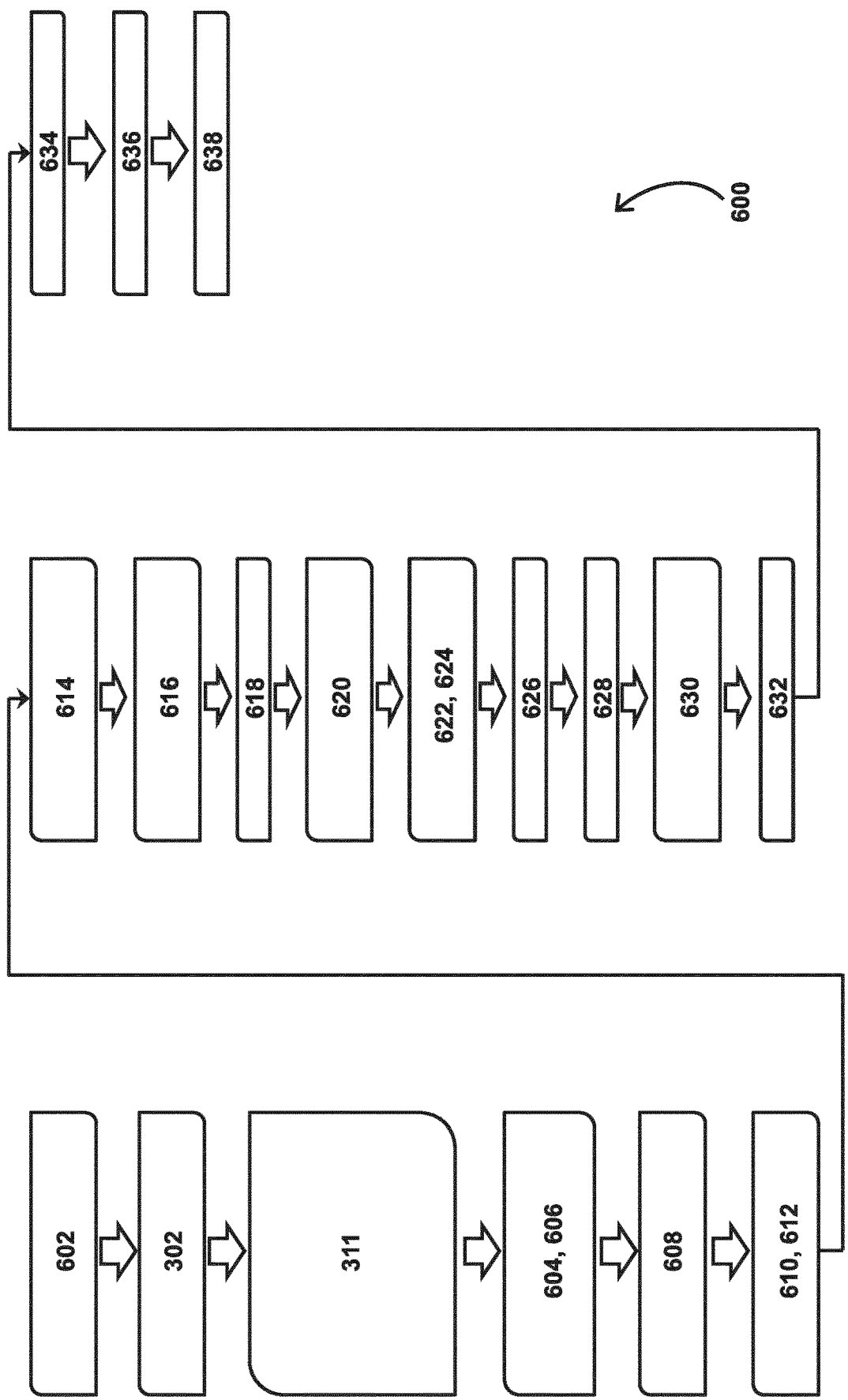
FIG. 6 illustrates how the operations of the present method are incorporated into a larger diffraction pattern guided source mask optimization flow, according to an embodiment.

By way of a non-limiting example, FIG. 6 illustrates how the operations of the present method described above are incorporated into a larger diffraction pattern guided SMO flow 600 (e.g., a leaf/ellipse, dipole/hexapole source optimization flow). Some and/or all of the operations shown in flow 600 in FIG. 6 may be considered to be part of the present method. Flow 600 begins with generation 602 of a wafer and/or pattern mask model (design) and an M3D (clip) library (e.g., using FEM+, Tachyon).

Flow 600 continues with determining 302 (also shown in FIG. 3A) a diffraction pattern and a pupil based on the wafer and/or pattern mask model (design), an initial pupil, and/or other information. Flow 600 includes determining the source variable region 311 from the diffraction pattern 312 (e.g., determined with a thin mask model in this case). As described above, this includes determining (and generating corresponding electronic files for), based on the diffraction pattern and a pupil fill ratio (PFR) threshold, the initial source (srcinit.src), the source variable location (srcloc.src), the source variable min (srcmin.src), the source variable max (srcmax.src), and/or other information (e.g., operations shown in FIG. 3B, FIG. 4, and FIG. 5 and described above).

In an embodiment, flow 600 comprises a continuous transmission mask (CTM) optimization 604 (e.g., optimize 95), and tuning 606 a dose and the mask, with an anchor pattern(s). In an embodiment, flow 600 comprises a CTM source-mask co-optimization 608 (e.g., optimize 100, optimize 110 (power4)). In an embodiment, flow 600 comprises sub resolution assist feature (SRAF) extraction 610 and mask simplification 612 (e.g., srafgen300, maskclean, pgm2mask3xx). In an embodiment, flow 600 comprises a polygon source-mask co-optimization 614 with no mask rule check (MRC) (opc500, opc600, opc601 (power4)). In an embodiment, flow 600 comprises a polygon mask clean and simplification 616 (maskclean700, pgm2mask701,710,720). In an embodiment, flow 600 comprises a focus and dose optimization 618 (opc800). It should be noted that operations 604-618 described in this paragraph may be skipped for a no SBAR (sub-resolution assist bar)] embodiment of flow 600.

Flow 600 comprises a polygon source mask co-optimization 620 with MRC (opc900, opc910). In an embodiment, flow 600 comprises mask focus depth tuning 622 and dose/focus optimization 624 (opc918, opc920). In an embodiment, flow 600 comprises an extreme ultraviolet (EUV) source discrete rendering 626 (srcrender970), a dose and focus optimization 628 (opc972), and a discrete source and polygon mask co-optimization 630 (opc974, opc976). It should be noted that operations 622-630 described in this paragraph may be necessary for an EUV only embodiment of flow 600.

Finally, flow 600 comprises generating 632 a Hopkin's model (modelgen1200), a dose optimization 634 (opc1800), a polygon optimization 636 (opc1910), and updating 638 the Hopkins model (modelgen2000). A Hopkin's model is an imaging model that can calculate imaging intensity at given location with given source profile, pupil profile, and a given mask profile. It is a fast approach with flexible accuracy setting compared with a standard model (Abbe's model), and is especially useful when a large area mask is present and both the source profile and pupil profile remain unchanged (for example in the opc1910 stage).

Figure 7:
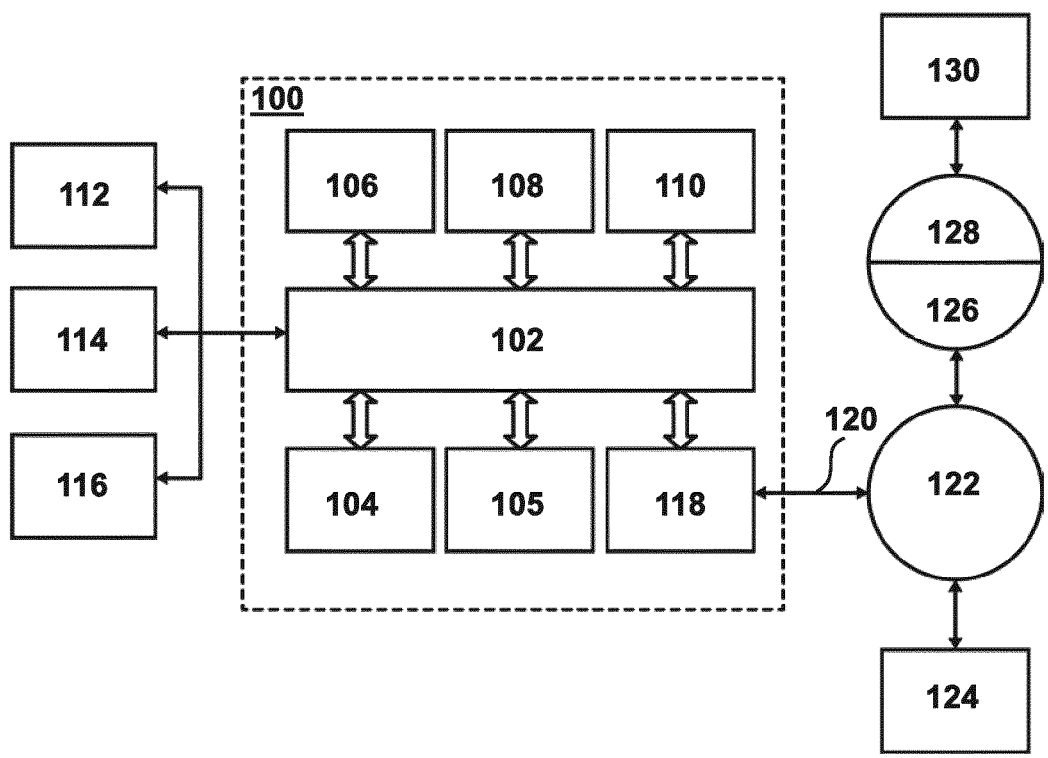
FIG. 7 is a block diagram of an example computer system, according to an embodiment.

FIG. 7 is a block diagram that illustrates a computer system 100 that can assist in implementing the methods, flows, or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer (e.g., a server and/or other computing devices), a solid-state storage device, and/or in other locations. The remote computer can load the instructions into its dynamic memory and send the instructions over a wireless communication network (e.g., the internet, a cellular communications network, etc.), through a telephone line using a modem, and/or by other methods. A modem and/or other data receiving components local to computer system 100 can receive the data via the wireless communication network, on the telephone line, etc., and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 8:
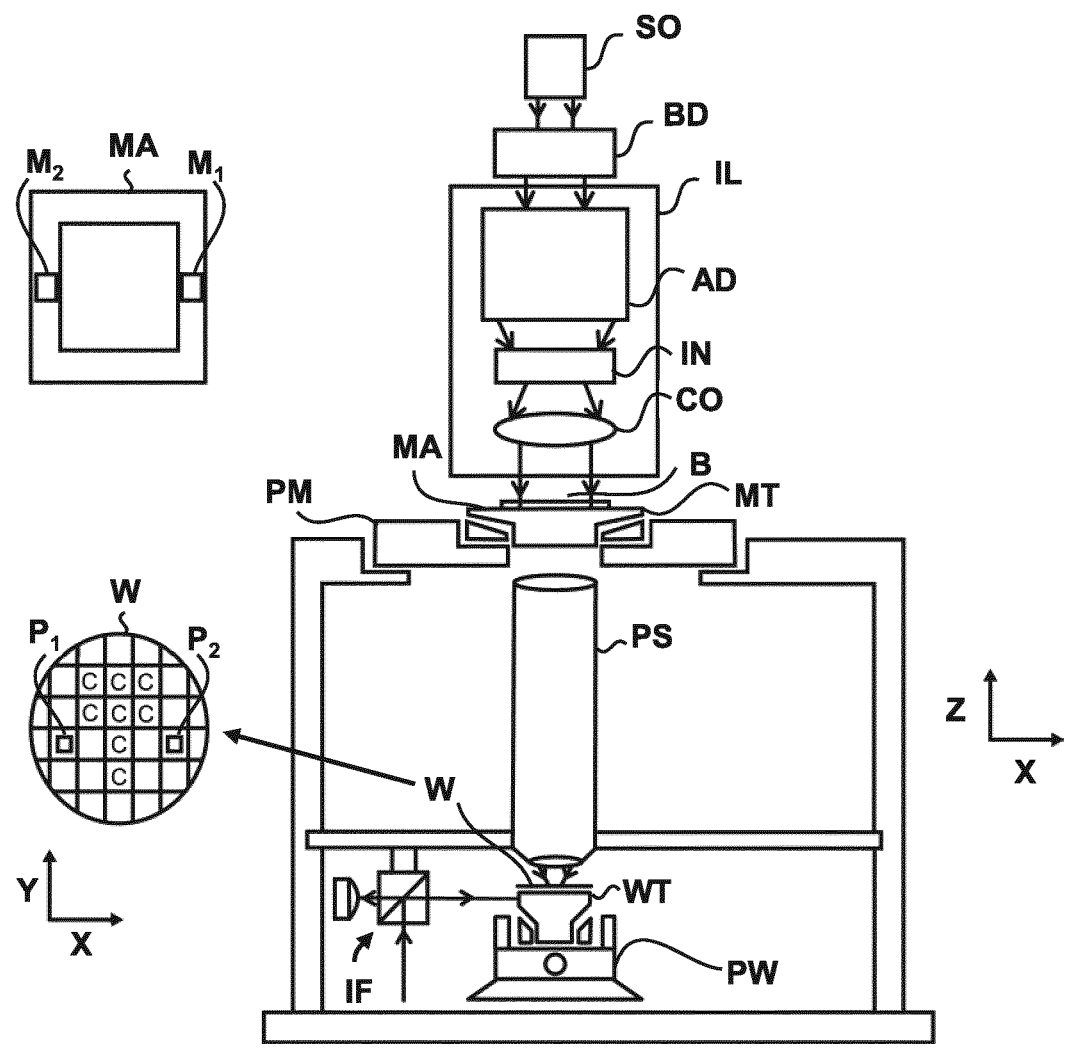
FIG. 8 is a schematic diagram of a lithographic projection apparatus, according to an embodiment.

FIG. 8 schematically depicts an exemplary lithographic projection apparatus that may be utilized in conjunction with the techniques described herein. The apparatus comprises:
- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS; and
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device relative to classic mask; examples include a programmable mirror array or LCD matrix.

The source SO (e.g., a mercury lamp or excimer laser, LPP (laser produced plasma), a free electron laser, or other EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 8 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors). This latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through the lens PS, which focuses the beam B onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 8. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 9:
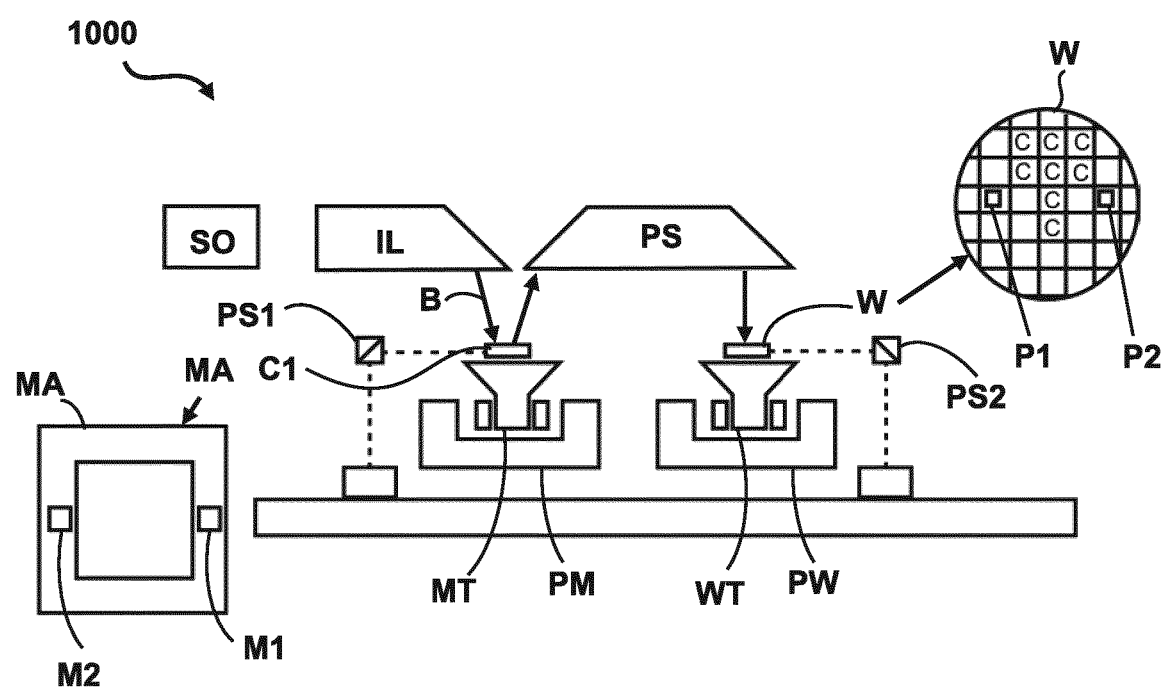
FIG. 9 is a schematic diagram of another lithographic projection apparatus, according to an embodiment.

FIG. 9 schematically depicts another exemplary lithographic projection apparatus 1000 that can be utilized in conjunction with the techniques described herein.

The lithographic projection apparatus 1000 comprises:

a source collector module SO an illumination system (illuminator) IL configured to condition a radiation beam B (e.g. EUV radiation).

a support structure (e.g. a patterning device table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion Cl (e.g. comprising one or more dies) of the substrate W.

As depicted in FIG. 9, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

The illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 9, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source. In an embodiment, a DUV laser source may be used.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

In step mode, the support structure (e.g. patterning device table) MT and the substrate table WT are kept essentially stationary, while an entire pattern imparted to the radiation beam is projected onto a target portion Cl at one time (i.e. a single static exposure). The substrate table WT is then shifted in the X and/or Y direction so that a different target portion Cl can be exposed.

In scan mode, the support structure (e.g. patterning device table) MT and the substrate table WT are scanned synchronously while a pattern imparted to the radiation beam is projected onto a target portion Cl (i.e. a single dynamic exposure). The velocity and direction of the substrate table WT relative to the support structure (e.g. patterning device table) MT may be determined by the (de-)magnification and image reversal characteristics of the projection system PS.

In another mode, the support structure (e.g. patterning device table) MT is kept essentially stationary holding a programmable patterning device, and the substrate table WT is moved or scanned while a pattern imparted to the radiation beam is projected onto a target portion Cl. In this mode, generally a pulsed radiation source is employed, and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 10:
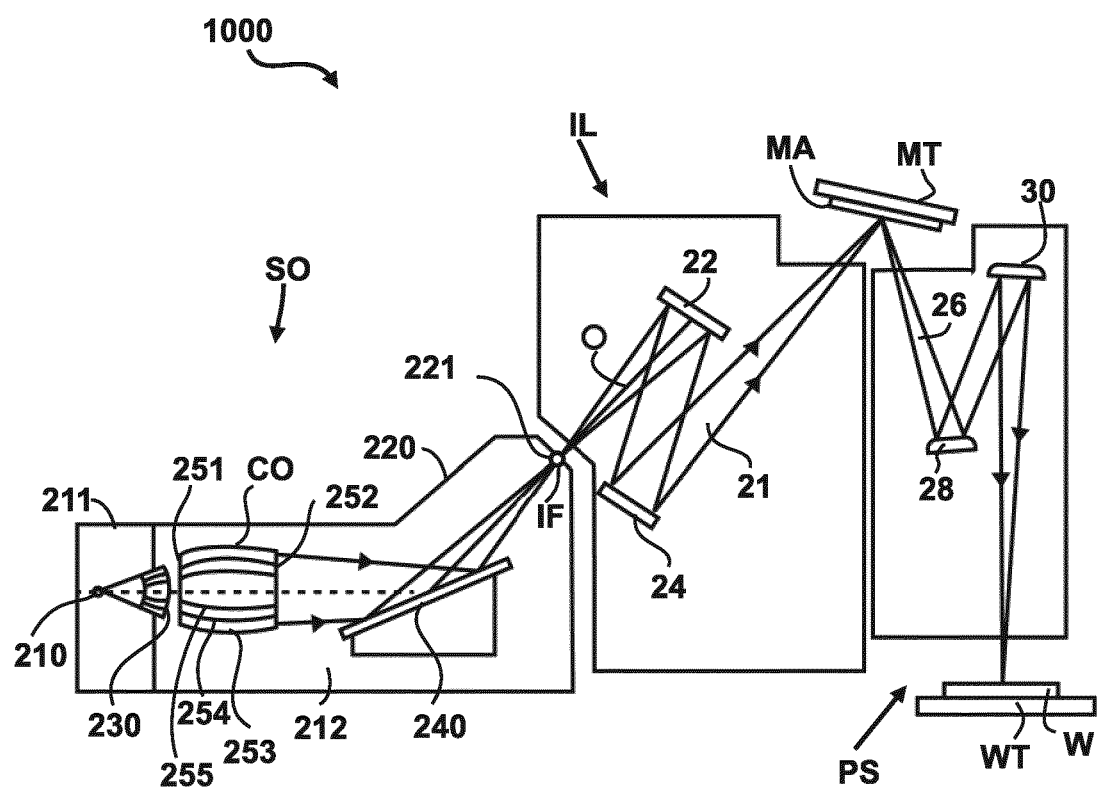
FIG. 10 is a more detailed view of the apparatus in FIG. 9, according to an embodiment.

FIG. 10 shows the apparatus 1000 in more detail, including the source collector module SO, the illumination system IL, and the projection system PS. The source collector module SO is configured such that a vacuum environment can be maintained in an enclosing structure 220 of the source collector module SO. An EUV radiation emitting plasma 210 may be formed by a discharge produced plasma source (and/or other sources as described above). EUV radiation may be produced by a gas or vapor, for example Xe gas, Li vapor or Sn vapor in which the hot plasma 210 is created to emit radiation in the EUV range of the electromagnetic spectrum. The hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line '0'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-10 or more additional reflective elements present in the projection system PS than shown in FIG. 10.

Collector optic CO, as further illustrated in FIG. 10, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 11:
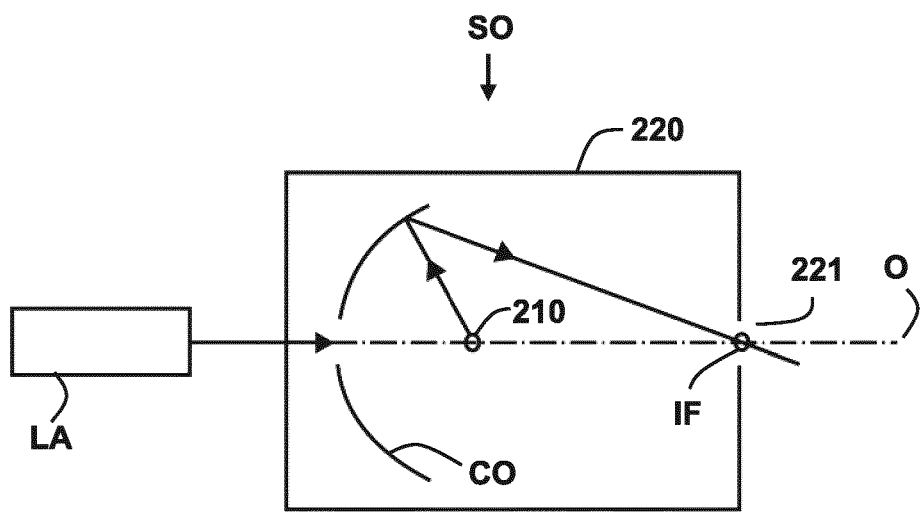
FIG. 11 is a more detailed view of the source collector module SO of the apparatus of FIG. 9 and FIG. 10, according to an embodiment.

Alternatively, the source collector module SO may be part of an LPP radiation system as shown in FIG. 11. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for configuring a lithographic apparatus, the method comprising:
   determining a source variable region from a diffraction pattern, the source variable region corresponding to one or more areas of a diffraction pattern of a pupil for which pupil variables are to be adjusted;
   adjusting the pupil variables for the one or more areas of the pupil that correspond to the source variable region; and
   rendering a final pupil based on the adjusted pupil variables.

2. The method of clause 1, further comprising determining the diffraction pattern and the pupil based on a pattern of a source mask design and an initial pupil.

3. The method of clause 1 or 2, wherein determining the source variable region for the diffraction pattern comprises selecting a region of interest in the diffraction pattern with different but overlapping diffraction orders.

4. The method of clause 3, wherein the source variable region in the diffraction pattern comprises a plurality of pixels in an image of the selected region of interest in the diffraction pattern, and wherein determining the source variable region further comprises binarization of the plurality of pixels in the image such that individual pixels are either included in the source variable region or excluded from the source variable region.

5. The method of clause 4, wherein the binarization is performed using a step function, a sigmoid or a hyperbolic binarization function, by applying the sigmoid and hyperbolic binarization functions sequentially, or by applying a clustering based image thresholding method.

6. The method of clause 4 or 5, wherein the source variable region comprises one or more source variable regions.

7. The method of clause 6, wherein non-zero intensity pixels are included in the one or more source variable regions and zero intensity pixels are excluded from the one or more source variable regions.

8. The method of any of clauses 6-7, wherein determining the one or more source variable regions further comprises dilation of a shape formed by the individual pixels included in the one or more source variable regions.

9. The method of clause 8, wherein binarization and dilation transform the diffraction pattern such that the one or more source variable regions meet a minimum pupil fill ratio value.

10. The method of any of clauses 1-9, wherein the diffraction pattern is determined using a full rigorous mask three dimensional (M3D) or compact mask three dimensional (M3D) effect or thin mask model.

11. The method of any of clauses 1-10, further comprising determining one or more additional diffraction patterns based on additional patterns of the source, design target, and a corresponding optimized mask, and wherein one or more source variable regions are further determined for the diffraction pattern and the one or more additional diffraction patterns.

12. The method of clause 1, wherein the source variable region in the diffraction pattern comprises a plurality of pixels in an image of the selected region of interest in the diffraction pattern, individual pixels of the plurality of pixels having a given intensity, the method further comprising adjusting diffraction pattern amplitude constrained variables to optimize diffraction pattern amplitude level variables, the adjusting of the diffraction pattern amplitude constrained variables to optimize the diffraction pattern amplitude level variables causing changes to pixels having a given intensity between a lower amplitude threshold and an upper amplitude threshold.

13. The method of any of clauses 1-12, wherein adjusting the pupil variables comprises a pixel base freeform, parametric base source optimization.

14. The method of any of clauses 1-13, further comprising determining the diffraction pattern constrained source variable region, adjusting the pupil variables in the diffraction pattern constrained source variable region, and rendering the final pupil based on the adjusted pupil variables in the diffraction pattern constrained source variable region, to enhance illumination efficiency and increase throughput in a source mask optimization (SMO) process.

15. The method of any of clauses 1-14, wherein determining the diffraction pattern constrained source variable region, adjusting the pupil variables in the diffraction pattern constrained source variable region, and rendering the final pupil based on the adjusted pupil variables in the diffraction pattern constrained source variable region, optimizes the pupil for generating an aerial image.

16. The method of any of clauses 1-15, wherein determining the diffraction pattern constrained source variable region, adjusting the pupil variables in the diffraction pattern constrained source variable region, and rendering the final pupil based on the adjusted pupil variables in the diffraction pattern constrained source variable region, optimizes the pupil for generating a resist image.

17. The method of any of clauses 1-16, wherein determining the diffraction pattern constrained source variable region, adjusting the pupil variables in the diffraction pattern constrained source variable region, and rendering the final pupil based on the adjusted pupil variables in the diffraction pattern constrained source variable region, are performed at any numerical aperture and/or wavelength.

18. The method of any of clauses 1-17, wherein determining the diffraction pattern constrained source variable region, adjusting the pupil variables in the diffraction pattern constrained source variable region, and rendering the final pupil based on the adjusted pupil variables in the diffraction pattern constrained source variable region, are performed as part of a memory chip, logic chip, and/or microprocessor chip fabrication process.

19. The method of any of clauses 1-18, wherein determining the diffraction pattern constrained source variable region, adjusting the pupil variables in the diffraction pattern constrained source variable region, and rendering the final pupil based on the adjusted pupil variables in the diffraction pattern constrained source variable region, are performed as part of a source optimization process with a fixed mask.

20. The method of any of clauses 1-18, wherein determining the diffraction pattern constrained source variable region, adjusting the pupil variables in the diffraction pattern constrained source variable region, and rendering the final pupil based on the adjusted pupil variables in the diffraction pattern constrained source variable region, are performed such that a performance parameter is maintained at an acceptable level.

21. The method of clause 20, wherein the performance parameter is edge placement error (EPE), image log slope (ILS), normalized image log slope (NILS), stochastic edge placement error (SEPE), and/or depth of focus (DOF).

22. The method of any of clauses 1-21, further comprising generating machine readable instructions that can be used for changing a source and/or a mask associated with the lithographic apparatus based on the rendered final pupil.

23. A computer program product comprising a non-transitory computer readable medium having instructions recorded thereon, the instructions when executed by a computer implementing the method of any of clauses 1-22.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet) patterning processes. EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method for configuring a lithographic apparatus or process, the method comprising:
   determining a source variable region from a diffraction pattern, the source variable region corresponding to one or more areas of a diffraction pattern of a pupil for which one or more pupil variables are to be adjusted;
   adjusting the one or more pupil variables for the one or more areas of the pupil that correspond to the source variable region; and
   rendering, by a hardware computer system, a final pupil based on the adjusted one or more pupil variables.

2. The method of claim 1, further comprising determining the diffraction pattern and the pupil based on a pattern of a source mask design and an initial pupil.

3. The method of claim 1, wherein determining the source variable region comprises selecting a region of interest in the diffraction pattern with different but overlapping diffraction orders, and/or wherein the source variable region comprises a plurality of pixels in an image of a region of interest in the diffraction pattern, and determining the source variable region further comprises binarization of the plurality of pixels in the image such that individual pixels are either included in the source variable region or excluded from the source variable region.

4. The method of claim 1, wherein the source variable region comprises a plurality of pixels in an image of a region of interest in the diffraction pattern,
wherein determining the source variable region further comprises binarization of the plurality of pixels in the image such that individual pixels are either included in the source variable region or excluded from the source variable region, and
wherein the binarization is:
performed using a step function, a sigmoid or a hyperbolic binarization function,
performed by applying sigmoid and hyperbolic binarization functions sequentially, or
performed by applying a clustering based image thresholding method.

5. The method of claim 1, wherein the source variable region comprises a plurality of pixels in an image of a region of interest in the diffraction pattern,
wherein determining the source variable region further comprises binarization of the plurality of pixels in the image such that individual pixels are either included in the source variable region or excluded from the source variable region, and
wherein non-zero intensity pixels are included in the source variable region and zero intensity pixels are excluded from the source variable region.

6. The method of claim 5, wherein determining the source variable region further comprises dilation of a shape formed by individual pixels included in the source variable region.

7. The method of claim 1, wherein the diffraction pattern is determined using a full rigorous or compact mask three dimensional (M3D) effect or a thin mask model.

8. The method of claim 1, further comprising determining one or more additional diffraction patterns based on additional patterns of illumination and design target, and a corresponding optimized mask, and wherein one or more source variable regions are further determined for the diffraction pattern and the one or more additional diffraction patterns.

9. The method of claim 1, wherein the source variable region comprises a plurality of pixels in an image of a region of interest in the diffraction pattern, individual pixels of the plurality of pixels having a given intensity, and the method further comprises adjusting diffraction pattern amplitude constrained variables to optimize diffraction pattern amplitude level variables, the adjusting of the diffraction pattern amplitude constrained variables causing changes to pixels having a given intensity between a lower amplitude threshold and an upper amplitude threshold.

10. The method of claim 1, wherein adjusting the one or more pupil variables comprises a pixel base freeform, parametric base source optimization.

11. The method of claim 1, further comprising determining a diffraction pattern constrained source variable region, adjusting one or more pupil variables in the diffraction pattern constrained source variable region, and rendering the final pupil based on the adjusted one or more pupil variables in the diffraction pattern constrained source variable region, to enhance illumination efficiency and increase throughput in a source mask optimization (SMO) process.

12. The method of claim 1, further comprising determining a diffraction pattern constrained source variable region, adjusting one or more pupil variables in the diffraction pattern constrained source variable region, and rendering the final pupil based on the adjusted one or more pupil variables in the diffraction pattern constrained source variable region, to optimize the pupil for generating an aerial image.

13. The method of claim 1, further comprising determining a diffraction pattern constrained source variable region, adjusting one or more pupil variables in the diffraction pattern constrained source variable region, and rendering the final pupil based on the adjusted one or more pupil variables in the diffraction pattern constrained source variable region, to optimize the pupil for generating a resist image.

14. The method of claim 1, further comprising determining a diffraction pattern constrained source variable region, adjusting pupil variables in the diffraction pattern constrained source variable region, and rendering the final pupil based on the adjusted pupil variables in the diffraction pattern constrained source variable region, at any numerical aperture and/or wavelength.

15. A computer program product comprising a non-transitory computer readable medium having instructions therein, the instructions, when executed by a computer system, configured to cause the computer system to at least:
determine a source variable region from a diffraction pattern, the source variable region corresponding to one or more areas of a diffraction pattern of a pupil for which one or more pupil variables are to be adjusted;
adjust the one or more pupil variables for the one or more areas of the pupil that correspond to the source variable region; and
render a final pupil based on the adjusted one or more pupil variables.

16. The computer program product of claim 15, wherein the instructions are further configured to cause the computer system to determine the diffraction pattern and the pupil based on a pattern of a source mask design and an initial pupil.

17. The computer program product of claim 15, wherein the instructions configured to cause the computer system to determine the source variable region are further configured to cause the computer system to:
select a region of interest in the diffraction pattern with different but overlapping diffraction orders, and/or
perform binarization of a plurality of pixels in an image of a region of interest in the diffraction pattern such that individual pixels are either included in the source variable region or excluded from the source variable region.

18. The computer program product of claim 15, wherein the diffraction pattern is determined using a full rigorous or compact mask three dimensional (M3D) effect or a thin mask model.

19. The computer program product of claim 15, wherein the instructions are further configured to cause the computer system to determine one or more additional diffraction patterns based on additional patterns of illumination and design target, and a corresponding optimized mask, and wherein one or more source variable regions are further determined for the diffraction pattern and the one or more additional diffraction patterns.

20. The computer program product of claim 15, wherein the source variable region comprises a plurality of pixels in an image of a region of interest in the diffraction pattern, individual pixels of the plurality of pixels having a given intensity, and the instructions are further configured to cause the computer system to adjust diffraction pattern amplitude constrained variables to optimize diffraction pattern amplitude level variables, the adjustment of the diffraction pattern amplitude constrained variables causing changes to pixels having a given intensity between a lower amplitude threshold and an upper amplitude threshold.

* * * * *